United States Patent
Ahn et al.

(10) Patent No.: US 12,287,499 B2
(45) Date of Patent: Apr. 29, 2025

(54) DISPLAY PANEL

(71) Applicant: Samsung Display Co., Ltd., Yongin-si (KR)

(72) Inventors: Jeaheon Ahn, Cheonan-si (KR); Jeongki Kim, Hwaseong-si (KR); Jong-Hoon Kim, Seoul (KR); YeoGeon Yoon, Suwon-si (KR); Myoungjong Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 838 days.

(21) Appl. No.: 17/298,530

(22) PCT Filed: Apr. 5, 2019

(86) PCT No.: PCT/KR2019/004112
§ 371 (c)(1),
(2) Date: May 28, 2021

(87) PCT Pub. No.: WO2020/116720
PCT Pub. Date: Jun. 11, 2020

(65) Prior Publication Data
US 2022/0019003 A1 Jan. 20, 2022

(30) Foreign Application Priority Data
Dec. 5, 2018 (KR) .................. 10-2018-0155145

(51) Int. Cl.
*G02B 5/20* (2006.01)
*G02F 1/1335* (2006.01)
(Continued)

(52) U.S. Cl.
CPC ....... *G02B 5/201* (2013.01); *G02F 1/133504* (2013.01); *G02F 1/133512* (2013.01);
(Continued)

(58) Field of Classification Search
CPC .............. G02B 5/201; G02F 1/133504; G02F 1/133512; G02F 1/133514; G02F 2202/36;
(Continued)

(56) References Cited

U.S. PATENT DOCUMENTS 9,680,054 B2   6/2017   Coe-Sullivan et al.
9,804,435 B2   10/2017  Itou et al.
(Continued)

FOREIGN PATENT DOCUMENTS

JP   2006-184379 A   7/2006
JP   2016-114884 A   6/2016
(Continued)

OTHER PUBLICATIONS

International Search Report for corresponding Application No. PCT/KR2019/004112 dated Sep. 2, 2019, 4pp.

*Primary Examiner* — William R Alexander
*Assistant Examiner* — Gabriel A Sanz
(74) *Attorney, Agent, or Firm* — Womble Bond Dickinson (US) LLP

(57) ABSTRACT

A display panel includes an upper display substrate. The upper display substrate includes a base substrate and first to fourth color filters. The first and second color filters overlap first and second pixel areas. The third color filter overlaps a light-blocking area and a third pixel area and has a first opening and a second opening corresponding to the first pixel area and second pixel area, respectively. The fourth color filter overlaps the first pixel area and the second pixel area and has a third opening corresponding to the third pixel area.

20 Claims, 11 Drawing Sheets

(51) Int. Cl.
H10K 50/854 (2023.01)
H10K 50/86 (2023.01)
H10K 59/12 (2023.01)
H10K 59/38 (2023.01)

(52) U.S. Cl.
CPC ..... *G02F 1/133514* (2013.01); *H10K 50/854* (2023.02); *H10K 50/865* (2023.02); *H10K 59/12* (2023.02); *H10K 59/38* (2023.02); *G02F 2202/36* (2013.01)

(58) Field of Classification Search
CPC ................ G02F 1/017; G02F 1/01791; G02F 1/133519; G02F 1/133621; G02F 1/136213; H10K 50/854; H10K 50/865; H10K 59/12; H10K 59/38; H10K 59/877; H10K 59/8792
See application file for complete search history.

(56) References Cited

U.S. PATENT DOCUMENTS

| | | | |
|---|---|---|---|
| 10,146,081 B2 | 12/2018 | Park et al. | |
| 10,216,037 B2 | 2/2019 | Kim et al. | |
| 10,613,370 B2 | 4/2020 | Choung et al. | |
| 10,698,255 B2 | 6/2020 | Park et al. | |
| 10,725,337 B2 | 7/2020 | Yoon et al. | |
| 11,513,385 B2 | 11/2022 | Park et al. | |
| 2008/0042146 A1* | 2/2008 | Cok | H10K 59/38 313/503 |
| 2012/0139866 A1* | 6/2012 | Jung | H01L 27/1443 257/E31.127 |
| 2015/0362795 A1* | 12/2015 | Chen | G02F 1/133512 257/40 |
| 2017/0343859 A1* | 11/2017 | Chen | G02B 5/201 |
| 2018/0122862 A1 | 5/2018 | Choi et al. | |
| 2018/0182814 A1* | 6/2018 | Kim | H10K 59/38 |
| 2018/0323248 A1* | 11/2018 | Jinta | H01L 29/78648 |
| 2019/0041701 A1* | 2/2019 | Chen | G02F 1/133617 |
| 2020/0083462 A1* | 3/2020 | Kurihara | C09K 11/06 |

FOREIGN PATENT DOCUMENTS

| | | |
|---|---|---|
| KR | 10-2017-0059027 A | 5/2017 |
| KR | 10-2018-0038608 A | 4/2018 |
| KR | 10-2018-0046568 A | 5/2018 |
| KR | 10-2018-0058215 A | 5/2018 |
| KR | 10-2018-0063943 A | 6/2018 |
| KR | 10-2018-0066936 A | 6/2018 |
| KR | 10-2018-0072033 A | 6/2018 |
| KR | 10-2018-0078926 A | 7/2018 |
| KR | 20180107443 A | 10/2018 |
| KR | 10-2020-0030147 A | 3/2020 |

\* cited by examiner

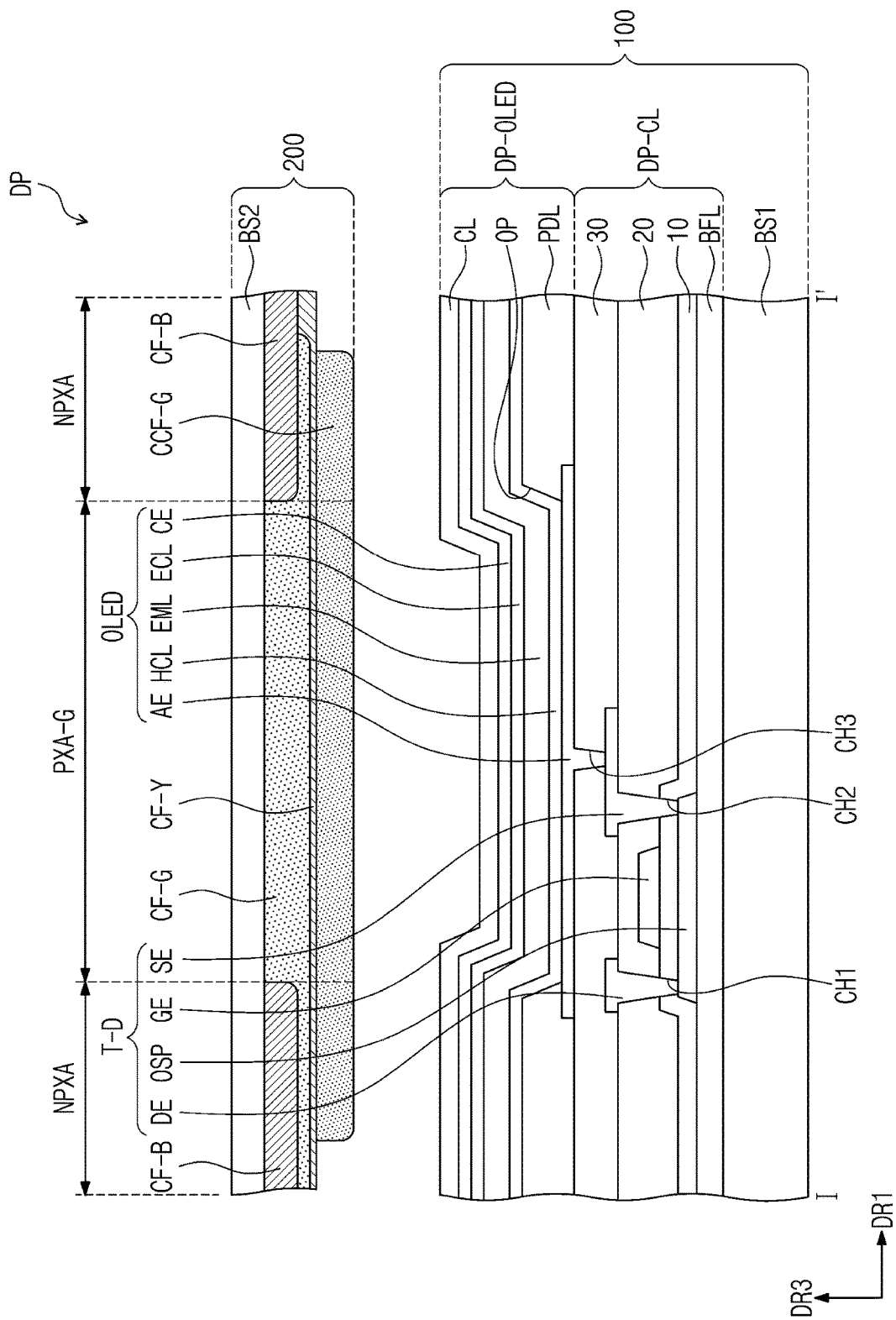

DISPLAY PANEL

CROSS-REFERENCE TO RELATED APPLICATIONS

This application is a U.S. National Phase Patent Application of International Patent Application Number PCT/KR2019/004112, filed on Apr. 5, 2019, which claims priority to Korean Patent Application Number 10-2018-0155145, filed on Dec. 5, 2018, the entire content of all of which is incorporated herein by reference.

BACKGROUND

1. Field

The present invention relates to a display panel, and more particularly, to a display panel including a color filter.

2. Description of Related Art

Display panels include transmissive display panels which allow source light generated from a light source to selectively pass therethrough and emissive display panels which generate source light by themselves. In order to generate color images, the display panels may include different types of color control layers depending on pixels. The color control layers may allow only a specific range of wavelengths of source light to pass therethrough, or convert the color of the source light. Some color control layers may also change the characteristics of light without changing the color of the source light.

SUMMARY

The purpose of the present invention is to provide a display panel in which a light-blocking area may be easily designed.

A display panel according to an embodiment of the present invention includes an upper display substrate which includes first, second, and third pixel areas and a light-blocking area around the first, second, and third pixel areas, and a lower display substrate which includes first, second, and third display elements that correspond to the first, second, and third pixel areas, respectively. The upper display substrate may include a base substrate, a first color filter which is disposed on the base substrate and overlaps the first pixel area, a second color filter which is disposed on the base substrate, overlaps the second pixel area, and allows light having a wavelength different from that of the first color filter to pass therethrough, a third color filter which is disposed on the base substrate, overlaps the light-blocking area and the third pixel area, has a first opening and a second opening corresponding to the first pixel area and the second pixel area, respectively, and allows light having a wavelength different from those of the first color filter and the second color filter to pass therethrough, and a fourth color filter which is disposed on the base substrate, overlaps the light-blocking area, the first pixel area, and the second pixel area, has a third opening corresponding to the third pixel area, and allows light having a wavelength different from that of the third color filter to pass therethrough.

The third color filter may be disposed directly on a lower surface of the base substrate, a portion of the third color filter may be disposed between the lower surface of the base substrate and the first color filter, and the first color filter may be disposed between the lower surface of the base substrate and the fourth color filter.

A portion of each of the first color filter and the second color filter may be disposed directly on the lower surface of the base substrate.

The upper display substrate further may include an encapsulation layer that covers the fourth color filter.

The upper display substrate may further include a first color control layer which overlaps the first pixel area and includes a first quantum dot that converts source light into first color light passing through the first color filter, and a second color control layer which overlaps the second pixel area and includes a second quantum dot that converts the source light into second color light passing through the second color filter.

The upper display substrate may further include a third color control layer which overlaps the third pixel area and allows the source light to pass therethrough.

The third color control layer may include a base resin and a scatterer dispersed in the base resin.

The upper display substrate may further include an encapsulation layer that covers the first to third color control layers.

Each of the first, second, and third display elements may include a first electrode, a second electrode, and a light-emitting layer disposed between the first electrode and the second electrode, and the light-emitting layers of the first, second, and third display elements may be integrally formed with each other.

Each of the first, second, and third display elements may include a liquid crystal capacitor.

A display panel according to an embodiment of the present invention may include an upper display substrate which includes first, second, and third pixel areas and a light-blocking area around the first, second, and third pixel areas, and a lower display substrate which includes first, second, and third light-emitting elements that correspond to the first, second, and third pixel areas, respectively, and generate blue light. The upper display substrate may include a base substrate, a color control layer which is disposed on a lower surface of the base substrate and converts the blue light into red light and green light, a red color filter which is disposed on the lower surface of the base substrate and overlaps the first pixel area, a green color filter which is disposed on the lower surface of the base substrate and overlaps the second pixel area, a blue color filter which is disposed on the lower surface of the base substrate, overlaps the light-blocking area and the third pixel area, and has first and second openings corresponding to the first and second pixel areas, respectively, and a yellow color filter which is disposed on the lower surface of the base substrate, overlaps the light-blocking area, the first pixel area, and the second pixel area, and has a third opening corresponding to the third pixel area.

The blue color filter may be disposed directly on the lower surface of the base substrate, a portion of the blue color filter may be disposed between the lower surface of the base substrate and the red color filter, and the red color filter may be disposed between the lower surface of the base substrate and the yellow color filter.

A portion of each of the red color filter and the green color filter may be disposed directly on the lower surface of the base substrate.

The color control layer may further include a first color control layer which overlaps the first pixel area and includes a first quantum dot that converts the blue light into the red light, and a second color control layer which overlaps the second pixel area and includes a second quantum dot that converts the blue light into the green light. The first color control layer may be disposed between the red color filter and the first light-emitting element, and the second color control layer may be disposed between the green color filter and the second light-emitting element.

The color control layer may further include a third color control layer which overlaps the third pixel area and allows the blue light to pass therethrough.

The third color control layer may include a base resin and a scatterer dispersed in the base resin.

A display panel according to an embodiment of the present invention may include an upper display substrate which includes first, second, and third pixel areas and a light-blocking area around the first, second, and third pixel areas, and a lower display substrate which includes first, second, and third light-emitting elements that correspond to the first, second, and third pixel areas, respectively, and generate blue light. The upper display substrate may include a base substrate, a color control layer which is disposed on a lower surface of the base substrate and converts the blue light into red light and green light, a blue light-blocking pattern which is disposed on the lower surface of the base substrate, overlaps the light-blocking area, and has first, second, and third openings corresponding to the first, second, and third pixel areas, respectively, a red color filter which is disposed on the lower surface of the base substrate and overlaps the first pixel area, a green color filter which is disposed on the lower surface of the base substrate and overlaps the second pixel area, a blue color filter which is disposed on the lower surface of the base substrate and overlaps the third pixel area, and a yellow color filter which is disposed on the lower surface of the base substrate, overlaps the light-blocking area, the first pixel area, and the second pixel area, and has a fourth opening corresponding to the third pixel area.

The blue light-blocking pattern may be disposed directly on the lower surface of the base substrate, a portion of each of the red color filter, the green color filter, and the blue color filter may be disposed directly on the lower surface of the base substrate, and a portion of the blue light-blocking pattern may be disposed between the lower surface of the base substrate and the red color filter.

The color control layer may further include a first color control layer which overlaps the first pixel area and includes a first quantum dot that converts the blue light into the red light, and a second color control layer which overlaps the second pixel area and includes a second quantum dot that converts the blue light into the green light. The first color control layer may be disposed between the red color filter and the first light-emitting element, and the second color control layer may be disposed between the green color filter and the second light-emitting element.

The color control layer may further include a third color control layer which overlaps the third pixel area and allows the blue light to pass therethrough.

As described above, the portion of the blue color filter and the yellow color filter overlapping the portion of the blue color filter may function as a light-blocking pattern of black color. The blue color filter has low external light reflection when compared to the light-blocking pattern of black color. The yellow color filter may prevent color mixing between pixels by blocking the blue light generated in the display panel, and may prevent light leakage in the light-blocking area.

BRIEF DESCRIPTION OF THE DRAWINGS

FIGS. 5A and 5B are cross-sectional views of display panels according to an embodiment of the present invention.

DETAILED DESCRIPTION

Figure 1A:
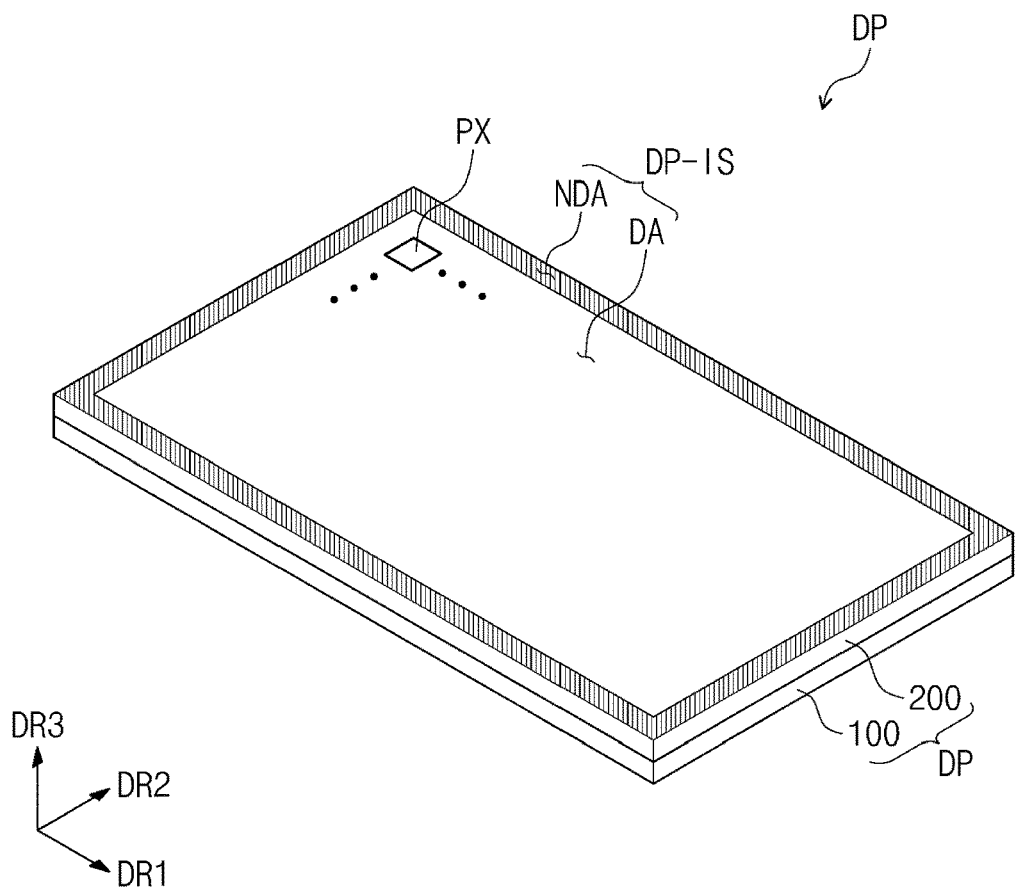
FIG. 1A is a perspective view of a display panel according to an embodiment of the present invention.

Since the present invention may have diverse modifications and various embodiments, specific embodiments are illustrated in the drawings and described in detail. However, this is not intended to limit the present invention within specific embodiments, and it should be understood that the present invention covers all the modifications, equivalents, and replacements within the idea and technical scope of the present invention.

In describing with reference to each drawings, similar reference symbols are given to similar components. In the accompanying drawings, the dimensions of structures are exaggerated or reduced for clarity of the present invention. Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present invention. The singular forms include the plural forms as well, unless the context clearly indicates otherwise.

In the present application, it will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof.

Figure 1B:
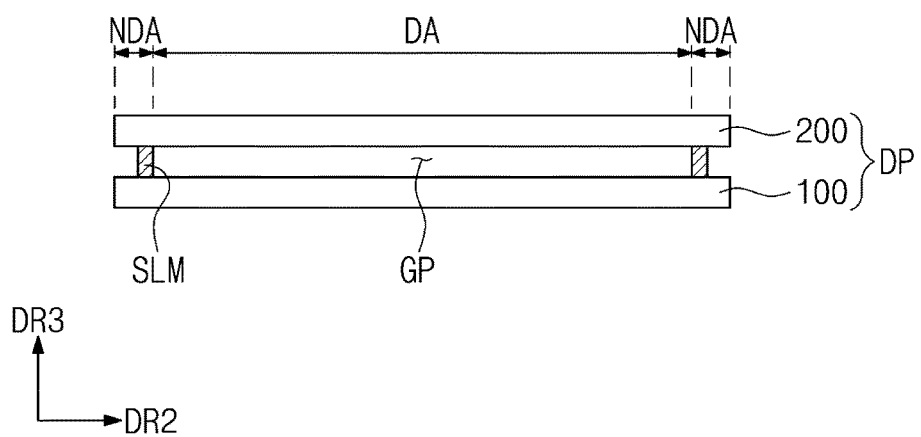
FIG. 1B is a cross-sectional view of a display panel according to an embodiment of the present invention.
Figure 2:
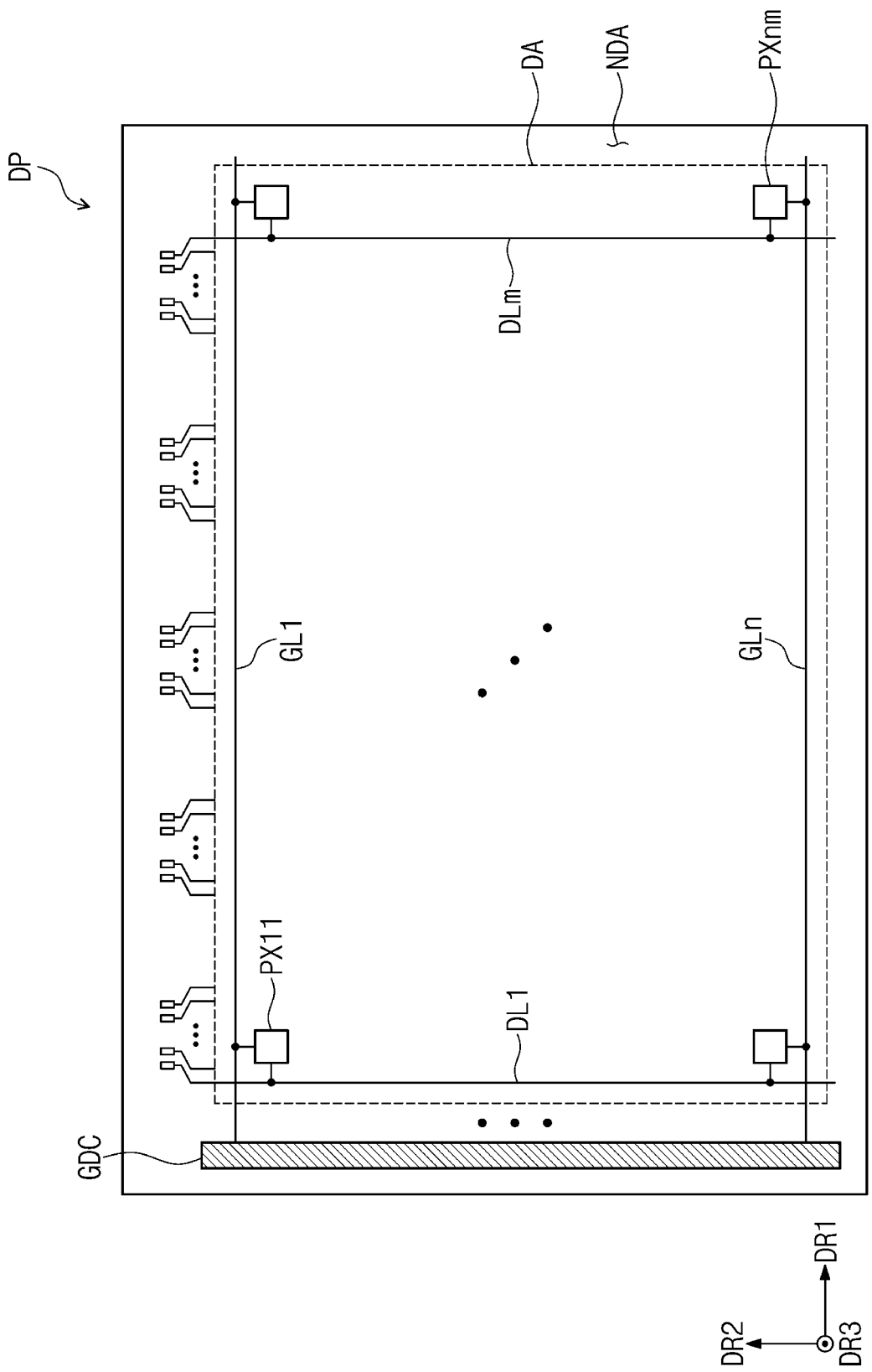
FIG. 2 is a plan view of a display panel according to an embodiment of the present invention.

FIG. 1A is a perspective view of a display panel DP according to an embodiment of the present invention. FIG. 1B is a cross-sectional view of the display panel DP according to an embodiment of the present invention. FIG. 2 is a plan view of the display panel DP according to an embodiment of the present invention.

Referring to FIGS. 1A-2, the display panel DP may be one of a liquid crystal display panel, an electrophoretic display panel, a microelectromechanical system (MEMS) display panel, an electrowetting display panel, or an organic light-emitting display panel, but the embodiment is not particularly limited thereto.

Although not illustrated separately, the display panel DP may further include a chassis member or a molding member, and may further include a backlight unit according to a type of the display panel DP.

The display panel DP may include a lower display substrate 100 (or a first display substrate) and an upper display substrate 200 (or a second display substrate) spaced apart from the lower display substrate 100 while facing the lower display substrate 100. A predetermined cell gap GP may be formed between the lower display substrate 100 and the upper display substrate 200.

The cell gap GP may be maintained by a sealant SLM that couples the lower display substrate 100 to the upper display substrate 200. The sealant SLM may include an organic adhesive member or an inorganic adhesive member. The sealant SLM may include frit.

As illustrated in FIG. 1A, the display panel DP may display an image IM through a display surface DP-IS. The display surface DP-IS is parallel to a plane defined by a first direction axis DR1 and a second direction axis DR2. The display surface DP-IS may include a display area DA and a non-display area NDA. A pixel PX is disposed in the display area DA, but the pixel PX is not disposed in the non-display area NDA. The non-display area NDA is defined along an edge of the display surface DP-IS. The display area DA may be surrounded by the non-display area NDA.

A normal direction of the display surface DP-IS, that is, a thickness direction of the display panel DP is indicated as a third direction axis DR3. A front surface (or a top surface) and a rear surface (or a lower surface) of each layer or each unit, which will be described below, are distinguished by the third direction axis DR3. However, the first to third direction axes DR1, DR2, and DR3 illustrated in the embodiment are merely examples. Hereinafter, first to third directions are defined as the directions indicated by the first to third direction axes DR1, DR2, and DR3, respectively, and are referred to as the same reference symbols.

The display device DP having a flat display surface DP-IS is illustrated in the embodiment of the present invention, but the embodiment of the present invention is not limited thereto. The display panel DP may include a curved display surface or a stereoscopic display surface. The stereoscopic display surface may include a plurality of display areas indicating directions different from each other.

FIG. 2 illustrates a planar arrangement relationship of signal lines GL1 to GLn and DL1 to DLm and pixels PX11 to PXnm. The signal lines GL1 to GLn and DL1 to DLm may include a plurality of gate lines GL1 to GLn and a plurality of data lines DL1 to DLm.

Each of the pixels PX11 to PXnm is connected to a corresponding gate line among the plurality of gate lines GL1 to GLn and a corresponding data line among the plurality of data lines DL1 to DLm. Each of the pixels PX11 to PXnm may include a pixel driving circuit and a display element. More various types of signal lines may be provided in the display panel DP according to the configuration of the pixel driving circuit.

The pixels PX11 to PXnm may be arranged in the form of matrix, but the embodiment is not limited thereto. The pixels PX11 to PXnm may be arranged in the form of PenTile. The pixels PX11 to PXnm may be arranged in the form of diamond (i.e., a diamond shape).

A gate driving circuit GDC may be disposed in the non-display area NDA. The gate driving circuit GDC may be integrated on the display panel DP by an oxide silicon gate (OSG) driver circuit process or an amorphous silicon gate (ASG) driver circuit process.

Figure 3A:
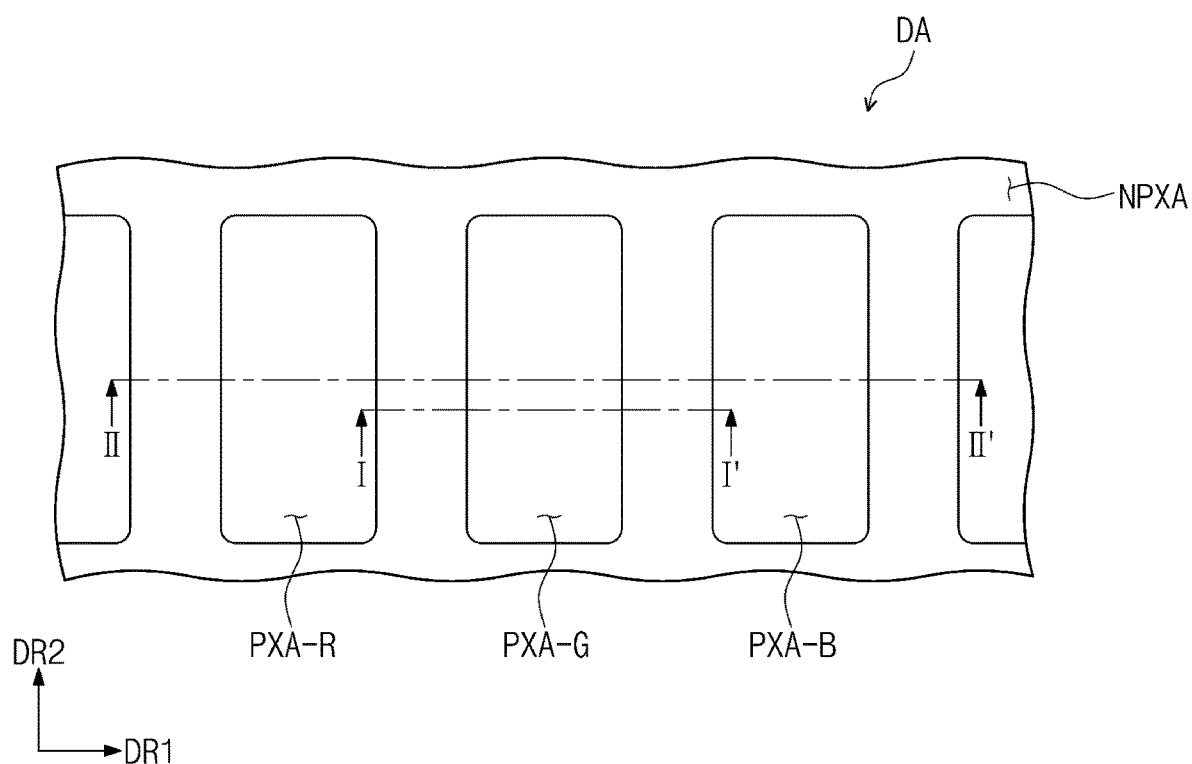
FIG. 3A is a plan view of pixel areas of a display panel according to an embodiment of the present invention.
Figure 3B:
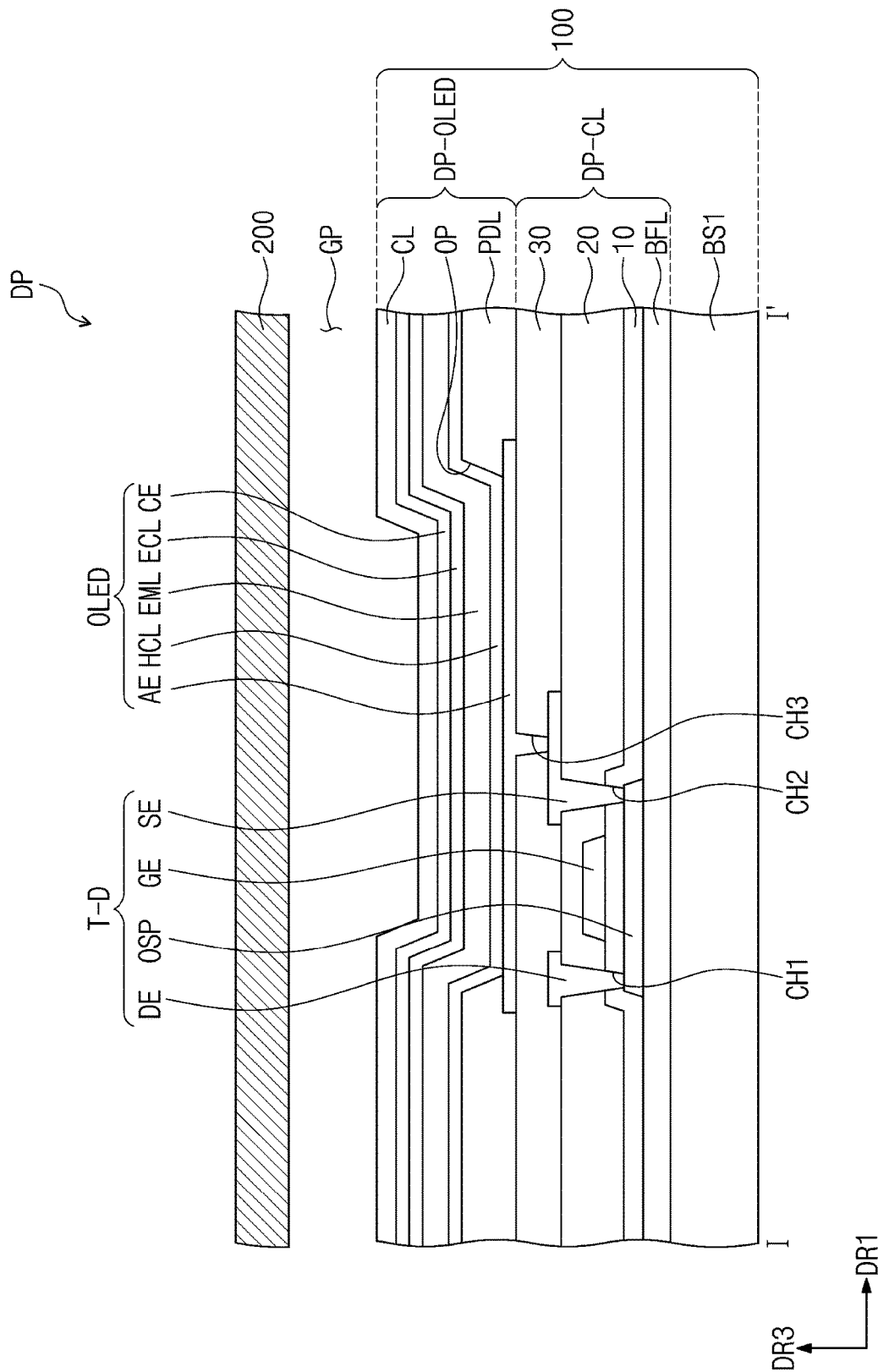
FIG. 3B is a cross-sectional view of a pixel area of a display panel according to an embodiment of the present invention.
Figure 3C:
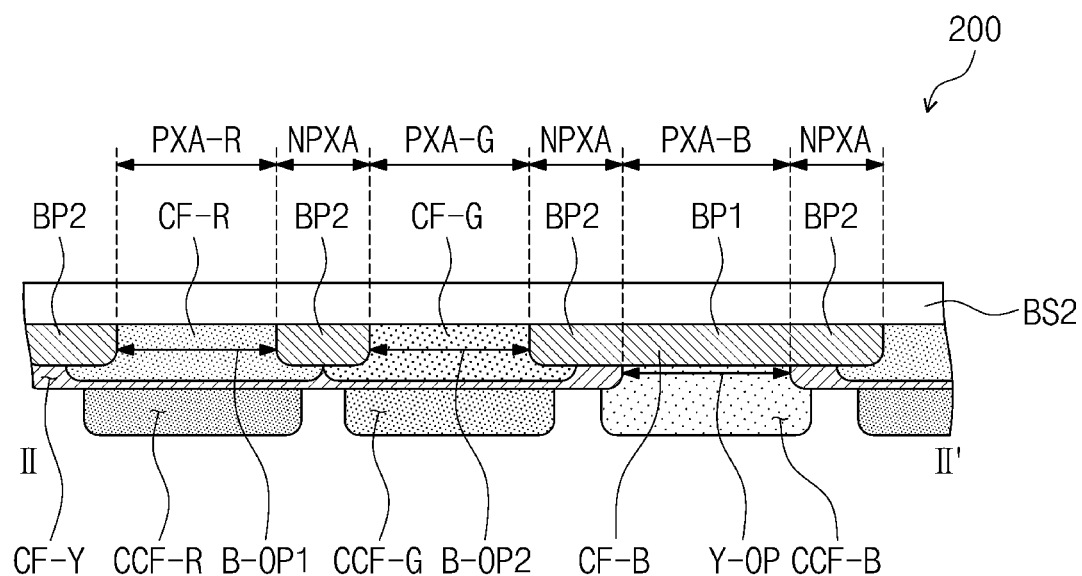
FIG. 3C is a cross-sectional view of an upper display substrate according to an embodiment of the present invention.
Figure 3D:
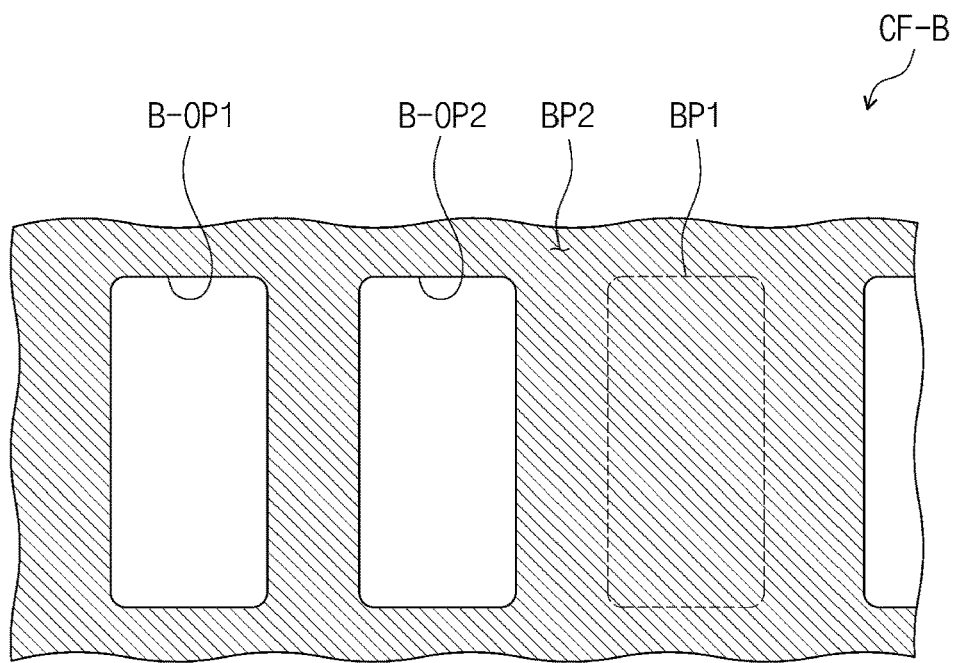
FIGS. 3D-3F are plan views of stack structures of an upper display substrate according to an embodiment of the present invention.
Figure 3E:
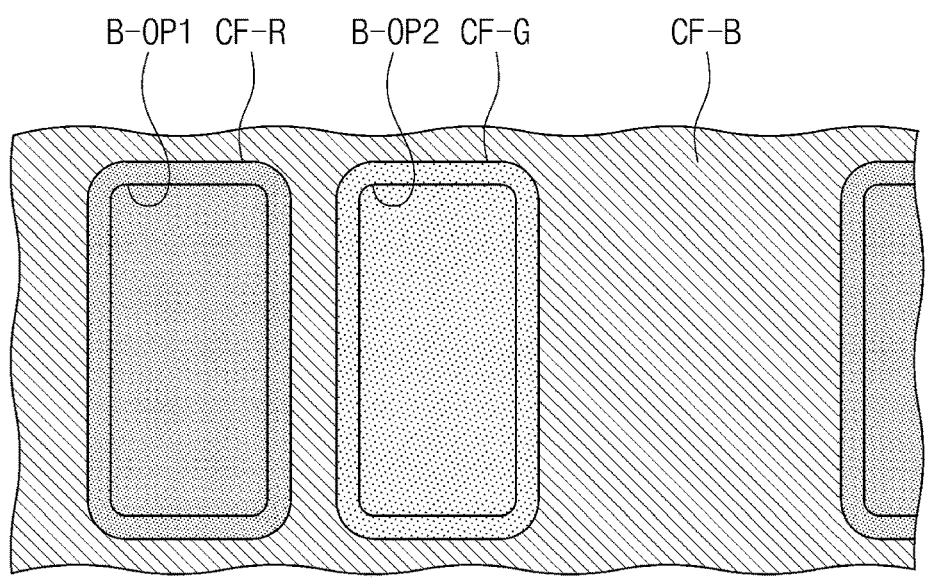
Figure 3F:
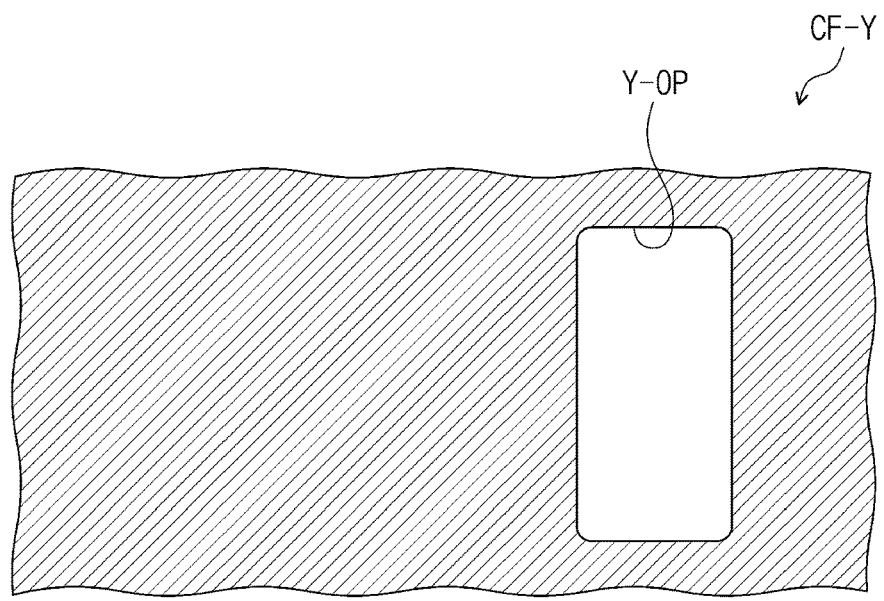
Figure 3G:
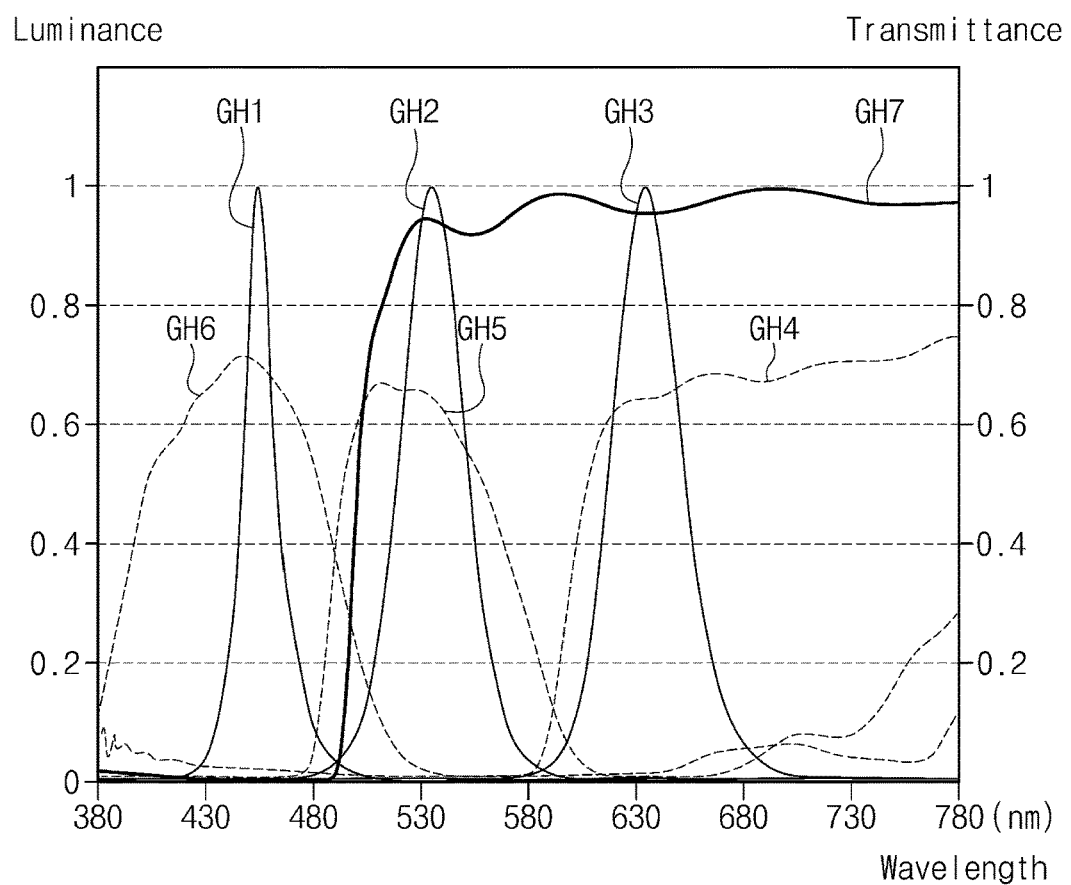
FIG. 3G is a graph illustrating emission spectra and transmission spectra of color filters according to an embodiment of the present invention.

FIG. 3A is a plan view of pixel areas PXA-R, PXA-G, and PXA-B of a display panel DP according to an embodiment of the present invention. FIG. 3B is a cross-sectional view of a pixel area PXA-G of the display panel DP according to an embodiment of the present invention. FIG. 3C is a cross-sectional view of the upper display substrate 200 according to an embodiment of the present invention. FIGS. 3D-3F are plan views of stack structures of the upper display substrate 200 according to an embodiment of the present invention. FIG. 3G is a graph illustrating emission spectra and transmission spectra of color filters according to an embodiment of the present invention. In the embodiment, an organic light-emitting display panel including a light-emitting element as a display element is illustrated as an example.

FIG. 3A is an enlarged view of a portion of the display area DA illustrated in FIG. 1A. Three types of pixel areas PXA-R, PXA-G, and PXA-B are mainly illustrated. The three types of pixel areas PXA-R, PXA-G, and PXA-B illustrated in FIG. 3A may be arranged repeatedly over the entirety of the display area DA.

A light-blocking area NPXA is disposed around the first to third pixel areas PXA-R, PXA-G, and PXA-B. The first to third pixel areas PXA-R, PXA-G, and PXA-B and the light-blocking area NPXA may be substantially defined in the upper display substrate 200.

The first to third pixel areas PXA-R, PXA-G, and PXA-B having the same area in a plan view are illustratively shown in the embodiment, but the embodiment is not limited thereto. The first to third pixel areas PXA-R, PXA-G, and PXA-B may have different areas, or at least two or more pixel areas may have different areas. The first to third pixel areas PXA-R, PXA-G, and PXA-B having a rectangular shape with rounded corners in a plan view are illustrated, but the embodiment is not limited thereto. The first to third pixel areas PXA-R, PXA-G, and PXA-B may have another polygonal shape in a plan view, and may have a regular polygonal shape with rounded corners.

One of the first to third pixel areas PXA-R, PXA-G, and PXA-B provides first color light to a user, another one of the first to third pixel areas PXA-R, PXA-G, and PXA-B provides second color light different from the first color light, and yet another one of the first to third pixel areas PXA-R, PXA-G, and PXA-B provides third color light different from the first color light and the second color light.

In the embodiment, the first pixel area PXA-R may provide red light, the second pixel area PXA-G may provide green light, and the third pixel area PXA-B may provide blue light. In the embodiment, source light may be blue light that is the third color light. The source light may be generated in a light source such as a backlight unit or generated in a display element such as a light-emitting diode.

The light-blocking area NPXA defines the boundaries of the first to third pixel areas PXA-R, PXA-G, and PXA-B and prevents color mixing between the first to third pixel areas PXA-R, PXA-G, and PXA-B. Also, the light-blocking area NPXA blocks the source light so that the source light is not provided to the user.

FIG. 3B illustrates a cross-section of the display panel DP corresponding to the second pixel area PXA-G. FIG. 3B illustratively shows a cross-section corresponding to a driving transistor T-D and a light-emitting element OLED. In FIG. 3B, the upper display substrate 200 is schematically illustrated.

As illustrated in FIG. 3B, the lower display substrate 100 includes a first base substrate BS1, a circuit element layer DP-CL disposed on the first base substrate BS1, and a display element layer DP-OLED disposed on the circuit element layer DP-CL.

The first base substrate BS1 may include a synthetic resin substrate or a glass substrate. The circuit element layer DP-CL includes at least one insulating layer and circuit elements. The circuit element includes a signal line, a driving circuit of a pixel, and the like. The circuit element layer DP-CL may be formed through a process of forming an insulating layer, a semiconductor layer, and a conductive layer using coating, deposition, or the like and a process of patterning the insulating layer, the semiconductor layer, and the conductive layer using a photolithography process.

In the embodiment, the circuit element layer DP-CL may include a buffer layer BFL a first insulating layer 10, a second insulating layer 20, and a third insulating layer 30. Each of the first insulating layer 10 and the second insulating layer 20 may be an inorganic layer, and the third insulating layer 30 may be an organic layer.

FIG. 3B illustratively shows the arrangement relationship between a semiconductor pattern OSP, a control electrode GE, an input electrode DE, and an output electrode SE which constitute the driving transistor T-D. First, second, and third through-holes CH1, CH2, and CH3 are also illustratively shown.

The display element layer DP-OLED includes the light-emitting element OLED. The light-emitting element OLED may generate the source light described above. The light-emitting element OLED includes a first electrode AE, a second electrode CE, and a light-emitting layer EML disposed therebetween. In the embodiment, the light-emitting element OLED may include an organic light-emitting diode. The display element layer DP-OLED includes a pixel defining layer PDL. For example, the pixel defining layer PDL may be an organic layer.

A first electrode AE is disposed on the third insulating layer 30. The first electrode AE is connected to the output electrode SE through a third through-hole CH3 that passes through the third insulating layer 30. An opening OP is defined in the pixel defining layer PDL. The opening OP of the pixel defining layer PDL allows at least a portion of the first electrode AE to be exposed. The exposed portion of the first sensing electrode AE may serve as a light-emitting area.

A hole control layer HCL, a light-emitting layer EML, and an electron control layer ECL may be commonly disposed over the first electrode AE and the pixel defining layer PDL. The hole control layer HCL, the light-emitting layer EML, and the electron control layer ECL may be commonly disposed over the first to third pixel areas PXA-R, PXA-G, and PXA-B (see FIG. 3A).

The hole control layer HCL may include a hole transport layer and may further include a hole injection layer. The light-emitting layer EML may generate the blue light. The blue light may include a wavelength of 410 nm to 480 nm. The emission spectrum of the blue light may have a maximum peak within a range of 440 nm to 460 nm. The electron control layer ECL may include an electron transport layer and may further include an electron injection layer. The light-emitting layer EML may have a tandem structure or a single layer structure.

A second electrode CE is disposed on the electron control layer ECL. The second electrode CE may be commonly disposed over the first to third pixel areas PXA-R, PXA-G, and PXA-B (see FIG. 3A). The second electrode CE may have an area larger than that of the first electrode AE. A cover layer CL for protecting the second electrode CE may be additionally disposed on the second electrode CE. The cover layer CL may include an organic material or an inorganic material. In an embodiment, the cover layer CL may be omitted.

Although not illustrated separately, the lower display substrate 100 may include first to third display elements respectively corresponding to the first to third pixel areas PXA-R, PXA-G, and PXA-B illustrated in FIG. 3A. The first to third display elements may have the same stack structure and may have the stack structure of the light-emitting element OLED illustrated in FIG. 3B, that is, the organic light-emitting diode.

As illustrated in FIG. 3C, the upper display substrate 200 may include a second base substrate BS2, first to fourth color filters CF-R, CF-G, CF-B, and CF-Y disposed on the lower surface of the second base substrate BS2, and first to third color control layers CCF-R, CCF-G, and CCF-B. Although not illustrated separately, in the embodiment of the present invention the display elements respectively corresponding to the first to third pixel areas PXA-R, PXA-G, and PXA-B may generate light having different colors, and the first to third color control layers CCF-R, CCF-G, and CCF-B may be omitted.

The second base substrate BS2 may include a synthetic resin substrate or a glass substrate. The first color filter CF-R overlapping the first pixel area PXA-R, the second color filter CF-G overlapping the second pixel area PXA-G, and the third color filter CF-B overlapping the third pixel area PXA-B are disposed on the lower surface of the second base substrate BS2. The first color filter CF-R, the second color filter CF-G, and the third color filter CF-B may allow different wavelengths to pass therethrough. In the embodiment, the first color filter CF-R may be a red color filter, the second color filter CF-G may be a green color filter, and the third color filter CF-B may be a blue color filter.

Each of the first color filter CF-R, the second color filter CF-G, and the third color filter CF-B includes a base resin and a dye and/or pigment dispersed in the base resin. The first color filter CF-R, the second color filter CF-G, and the third color filter CF-B may include different types of dyes/pigments.

The first pixel area PXA-R and the second pixel area PXA-G may be substantially defined by a first opening B-OP1 and a second opening B-OP2 of the third color filter CF-B illustrated in FIG. 3D. The third color filter CF-B is disposed directly on the lower surface of the second base substrate BS2.

The third color filter CF-B illustrated in FIGS. 3C and 3D also overlaps the light-blocking area NPXA. The third color filter CF-B may be substantially divided into a filter portion BP1 serving as a color filter a light-blocking portion BP2 serving as a light-blocking pattern. An organic layer having blue color is formed on one surface of the second base substrate BS2, and then the organic layer is exposed and developed, whereby the third color filter CF-B including the first and second openings B-OP1 and B-OP2 may be formed. Thus, the filter portion BP1 and the light-blocking portion BP2 have an integrated shape.

A portion of each of the first color filter CF-R and the second color filter CF-G is disposed directly on the lower surface of the second base substrate BS2. Another portion of each of the first color filter CF-R and the second color filter CF-G may overlap the third color filter CF-B. That is, a portion of the third color filter CF-B is disposed between the lower surface of the second base substrate BS2 and the first color filter CF-R, and another portion of the third color filter CF-B is disposed between the lower surface of the second base substrate BS2 and the second color filter CF-G.

As illustrated in FIG. 3E, the first color filter CF-R overlaps the first opening B-OP1, and the second color filter CF-G overlap the second opening B-OP2. The first color filter CF-R and the second color filter CF-G may overlap each other in a plan view or may not overlap each other in a plan view.

As illustrated in FIG. 3C, the fourth color filter CF-Y is disposed on the lower surface of the second base substrate BS2. The fourth color filter CF-Y overlaps the light-blocking area NPXA, the first pixel area PXA-R, and the second pixel area PXA-G. As illustrated in FIGS. 3C and 3F, a third opening Y-OP corresponding to the third pixel area PXA-B is defined in the fourth color filter CF-Y.

As illustrated in FIG. 3C, the fourth color filter CF-Y may cover the first and second color filters CF-R and CF-G and allow the third color filter CF-B to be exposed. The first color filter CF-R may be disposed between the fourth color filter CF-Y and the lower surface of the second base substrate BS2. The fourth color filter CF-Y allows a wavelength different from that of the third color filter CF-B to pass therethrough, and the fourth color filter CF-Y may be a yellow color filter in the embodiment.

As illustrated in FIG. 3C, the first color control layer CCF-R and the second color control layer CCF-G are disposed below the fourth color filter CF-Y. Each of the first color control layer CCF-R and the second color control layer CCF-G absorbs the source light and generates light having different color from the source light. Each of the first color control layer CCF-R and the second color control layer CCF-G may be a light conversion layer. The first color control layer CCF-R generates light which may pass through the first color filter CF-R, and the second color control layer CCF-G generates light which may pass through the second color filter CF-G.

Each of the first color control layer CCF-R and the second color control layer CCF-G may include a base resin and quantum dots mixed (or dispersed) in the base resin. The base resin may be a medium in which quantum dots are dispersed, and may include various resin compositions which may be generally referred to as a binder. However, the embodiment is not limited thereto, and in the present specification, any medium capable of dispersing and arranging the quantum dots may be referred to as a base resin regardless of its name, additional other functions, constituent materials, and the like. The base resin may be a polymer resin. For example, the base resin may be an acrylic-based resin, a urethane-based resin, a silicon-based polymer, an epoxy-based resin, and the like. The base resin may be a transparent resin.

The quantum dots may be particles which convert a wavelength of incident light. The quantum dots are materials having crystal structures with sizes of several nanometers, are composed of several hundreds to several thousands of atoms, and exhibit a quantum confinement effect in which an energy band gap increases due to small sizes thereof. When light with a wavelength having higher energy than the band gap is incident on the quantum dots, the quantum dots are excited by absorbing the light and transition to a ground state while emitting light having a specific wavelength. The wavelength of the emitted light has a value corresponding to the band gap. When the sizes and compositions of the quantum dots are adjusted, the emission characteristics due to the quantum confinement effect may be controlled.

The first color control layer CCF-R may include a first quantum dot, and the second color control layer CCF-G may include a second quantum dot different from the first quantum dot. The first quantum dot may absorb the blue light and then generate the red light. The second quantum dot may absorb the blue light and then generate the green light.

The quantum dots may be selected from the group consisting of a group II-VI compound, a group III-V compound, a group IV-VI compound, a group IV element, a group IV compound, and a combination thereof.

The group II-VI compound may be selected from the group consisting of: a binary element compound selected from the group consisting of CdSe, CdTe, ZnS, ZnSe, ZnTe, ZnO, HgS, HgSe, HgTe, MgSe, MgS, and a mixture thereof; a ternary element compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from the group consisting of: a binary element compound selected from the group consisting of GaN, GaP, GaAs, GaSb, AlN, AlP, AlAs, AlSb, InN, InP, InAs, InSb, and a mixture thereof; a ternary element compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The IV-VI compound may be selected from the group consisting of: a binary element compound selected from the group consisting of SnS, SnSe, SnTe, PbS, PbSe, PbTe, and a mixture thereof; a ternary element compound selected from the group consisting of SnSeS, SnSeTe, SnSTe, PbSeS, PbSeTe, PbSTe, SnPbS, SnPbSe, SnPbTe, and a mixture thereof; and a quaternary element compound selected from the group consisting of SnPbSSe, SnPbSeTe, SnPbSTe, and a mixture thereof. The group IV element may be selected from the group consisting of Si, Ge, and a mixture thereof. The group IV compound may be a binary element compound selected from the group consisting of SiC, SiGe, and a mixture thereof.

Here, the binary element compound, the ternary element compound, or the quaternary element compound may exist in particles at a uniform concentration, or in the same particle while being divided to have partially different concentration distributions.

The quantum dots may have a core-shell structure including a core and a shell surrounding the core. In addition, it is possible to have a core/shell structure in which one quantum dot surrounds another quantum dot. The interface between the core and shell may have a concentration gradient in which the concentration of elements present in the shell is gradually reduced toward the center.

The quantum dots may be particles having nanometer-scale sizes. The quantum dots may have a full width at half maximum (FWHM) of an emission wavelength spectrum of about 45 nm or less, preferably about 40 nm or less, and more preferably about 30 nm or less, and in this range, color purity and color reproducibility may be improved. Also, light emitted through such quantum dots is emitted in all directions, so that an optical viewing angle may be improved.

In addition, the quantum dots have shapes which are commonly used in related fields and are not particularly limited. However, more specifically, shapes such as spherical shapes, pyramidal shapes, multi-arm shapes, cubic nanoparticles, nanotubes, nanowires, nanofibers, and nano plate-like particles may be used.

As illustrated in FIG. 3C, the third color control layer CCF-B is disposed below the third color filter CF-B. The third color control layer CCF-B allows the source light to pass therethrough. The third color control layer CCF-B may include a base resin and may further include scattering particles. The scattering particles may be titanium oxide ($TiO_2$) particles, silica-based nanoparticles, or the like.

In an embodiment of the present invention, the third color control layer CCF-B may be omitted. In an embodiment of the present invention, the first color control layer CCF-R and the second color control layer CCF-G may also further include scattering particles.

In FIG. 3G, a first graph GH1 shows an emission spectrum of the source light, a second graph GH2 shows an emission spectrum of the second color control layer CCF-G, and specifically, an emission spectrum of the first quantum dot, and a third graph GH3 shows an emission spectrum of the first color control layer CCF-R. A fourth graph GH4, a fifth graph GH5, a sixth graph GH6, and a seventh graph GH7 show transmission spectra of the first color filter CF-R, the second color filter CF-G, the third color filter CF-B, and the fourth color filter CF-Y, respectively.

The first color control layer CCF-R may absorb the blue light and then generate first color light having a wavelength of 580 nm to 675 nm. The emission spectrum of the first color light may have a maximum peak within a range of 610 nm to 645 nm. The second color control layer CCF-G may absorb the blue light and then generate second color light having a wavelength of 500 nm to 570 nm. The emission spectrum of the second color light may have a maximum peak within a range of 515 nm to 545 nm.

Referring to FIGS. 3C and 3G, most of the first color light generated in the first color control layer CCF-R pass through the fourth color filter CF-Y, and then the first color light is provided to the outside via the first color filter CF-R. The first color filter CF-R may allow 60% or more of the incident first color light to pass therethrough. The first color filter CF-R may allow about 60% to about 70% of the incident first color light to pass therethrough.

Most of the second color light generated in the second color control layer CCF-G pass through the fourth color filter CF-Y, and then the second color light is provided to the outside via the second color filter CF-G. The second color filter CF-G may allow 55% or more of the incident second color light to pass therethrough. The second color filter CF-G may allow about 60% to about 70% of the incident second color light to pass therethrough. The source light, which is the third color light, is provided to the outside via the third color control layer CCF-B and the third color filter CF-B. The third color filter CF-B may allow 65% or more of the incident source light to pass therethrough. The third color filter CF-B may allow about 65% to about 75% of the incident source light to pass therethrough.

Referring to FIGS. 3C and 3G, most of the source light, which is the blue light, is blocked by the fourth color filter CF-Y, and thus the source light does not pass through the first and second pixel areas PXA-R and PXA-G and the light-blocking area NPXA. Thus, color mixing between the pixel areas and light leakage in the light-blocking area NPXA are reduced.

Also, the first to third color filters CF-R, CF-G, and CF-B disposed directly on the lower surface of the second base substrate BS2 reduce the external light reflection. This is possible because each of the first to third color filters CF-R, CF-G, and CF-B allows light having a specific range of wavelengths to pass therethrough but absorbs light having wavelengths other than the specific range of wavelengths.

According to the embodiment, the light-blocking portion BP2 illustrated in FIG. 3C and the yellow color filter CF-Y overlapping the light-blocking portion BP2 may function as a black matrix. According to the embodiment, a light-blocking pattern (or a black matrix) of black color including carbon may be omitted, and thus the external light reflection may be reduced. Also, misalignment with other structures, which occurs during a process of forming the black light-blocking pattern having openings that correspond to the first to third pixel areas PXA-R, PXA-G, and PXA-B (see FIG. 3C), may be reduced.

Also, light partially reflected through the first to third color filters CF-R, CF-G, and CF-B may not have a specific color. This is because the reflected light includes components in the entire wavelength range of visible light.

FIGS. 4A-4D are cross-sectional views of upper display substrates 200 according to an embodiment of the present invention. Each of FIGS. 4A-4D illustrates a cross-section corresponding to that of FIG. 3C. Hereinafter, detailed description of the same components as those described with reference to FIGS. 1-3G will be omitted.

Figure 4A:
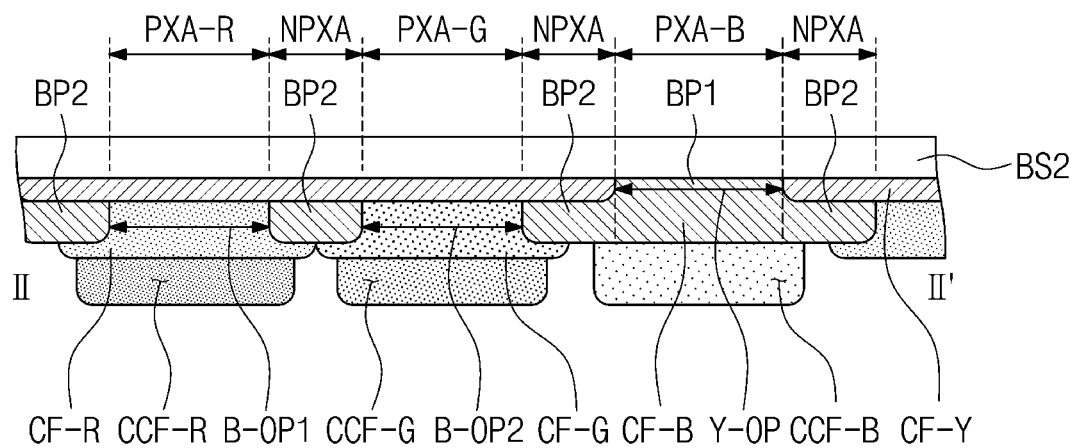
FIGS. 4A-4D are cross-sectional views of upper display substrates according to an embodiment of the present invention.

As illustrated in FIG. 4A, the stacking order of a first color filter CF-R, a second color filter CF-G, a third color filter CF-B, and a fourth color filter CF-Y may be changed. The fourth color filter CF-Y may be disposed directly on the lower surface of the second base substrate BS2. A light-blocking portion BP2 is disposed below the fourth color filter CF-Y. A filter portion BP1 may be disposed directly on the lower surface of the second base substrate BS2. A first color control layer CCF-R and a second color control layer CCF-G may be disposed directly on the lower sides of the first color filter CF-R and the second color filter CF-G, respectively.

Figure 4B:
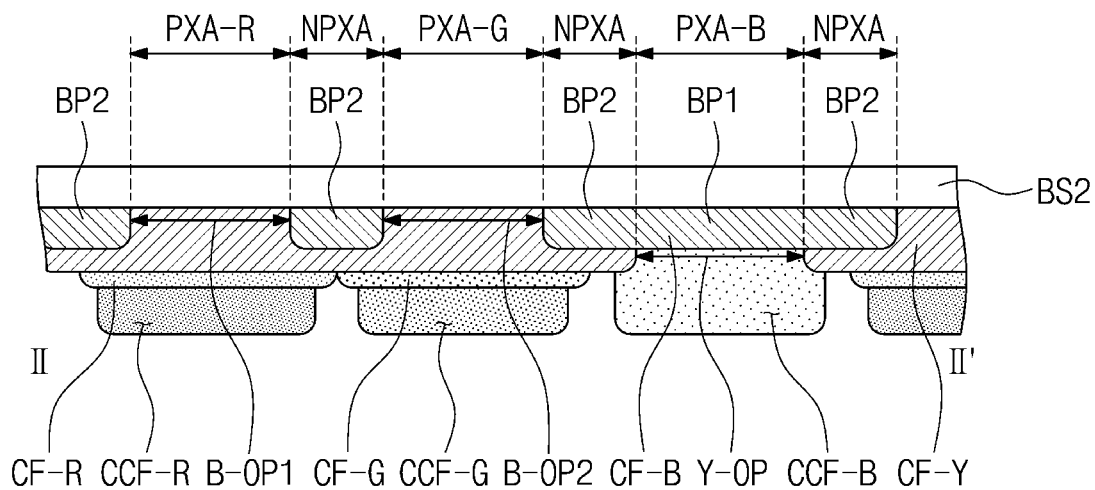

As illustrated in FIG. 4B, the stacking order of a first color filter CF-R, a second color filter CF-G, and a fourth color filter CF-Y may be changed. A third color filter CF-B may be disposed directly on the lower surface of the second base substrate BS2. A portion of the fourth color filter CF-Y may be disposed directly on the lower surface of the second base substrate BS2. The first color filter CF-R and the second color filter CF-G may be disposed directly on the lower side of the fourth color filter CF-Y.

Figure 4C:
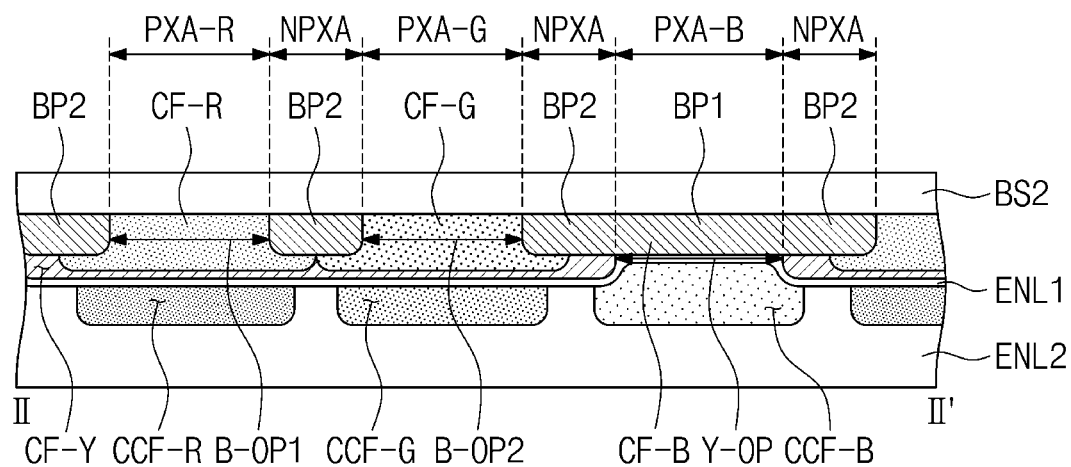

As illustrated in FIG. 4C, an upper display substrate 200 may further include at least one encapsulation layer. A first encapsulation layer ENL1 may cover the first color filter CF-R, the second color filter CF-G, the third color filter CF-B, and the fourth color filter CF-Y. The first encapsulation layer ENL1 may include an inorganic layer. The first encapsulation layer ENL1 may include any one of a silicon oxide, a silicon nitride, or a silicon oxynitride. The first encapsulation layer ENL1 may further include an organic layer that provides a flat lower surface.

A second encapsulation layer ENL2 may cover first to third color control layers CCF-R, CCF-G, and CCF-B. The second encapsulation layer ENL2 may include an inorganic layer. The second encapsulation layer ENL2 may further include an organic layer which is disposed below the inorganic layer so as to provide a flat lower surface.

Figure 4D:
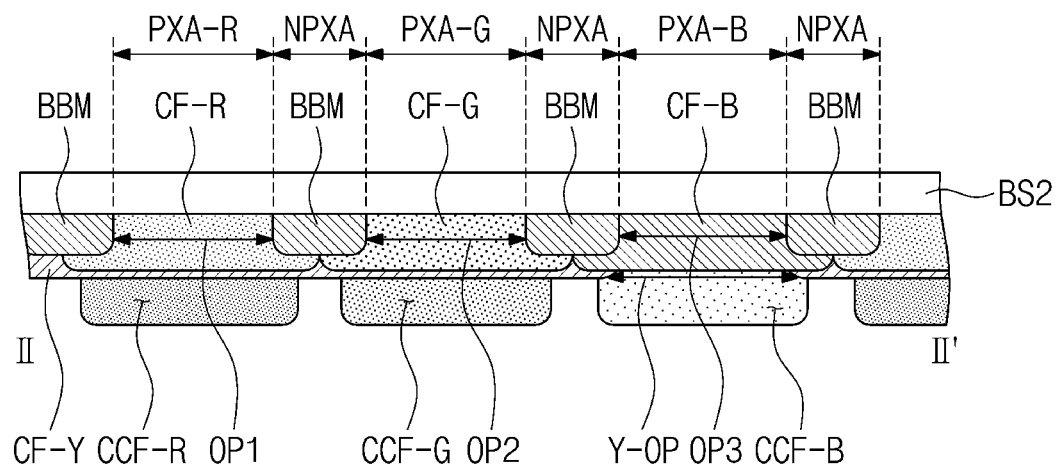

Although FIGS. 3C and 3D illustrate that the third color filter CF-B includes the filter portion BP1 and the light-blocking portion BP2 integrated with each other, a filter portion and a light-blocking portion may be divided from each other as illustrated in FIG. 4D. The filter portion may be a third color filter CF-B, and the light-blocking portion may be a light-blocking pattern BBM. The third color filter CF-B may be a blue color filter, and the light-blocking pattern BBM may be a light-blocking pattern of black color. The light-blocking pattern BBM may be defined as a first blue color filter, and a third color filter CF-B may be defined as a second blue color filter.

First to third openings OP1, OP2, and OP3 respectively corresponding to the first to third pixel areas PXA-R, PXA-G, and PXA-B are defined in the light-blocking pattern BBM. The third color filter CF-B overlaps the third opening OP3. The opening Y-OP of the fourth color filter CF-Y may correspond to the third opening OP3.

The third color filter CF-B and the light-blocking pattern BBM may be formed using the same material through different processes. The third color filter CF-B and the light-blocking pattern BBM may be formed using materials having different compositions through different processes. Even though the third color filter CF-B and the light-blocking pattern BBM have similar optical characteristics, the transmission spectra of the third color filter CF-B and the light-blocking pattern BBM may be different from each other due to the different compositions. For example, the light-blocking pattern BBM may have a lower transmittance for blue light and a larger range for wavelength blocking than the third color filter CF-B.

Figure 5A:
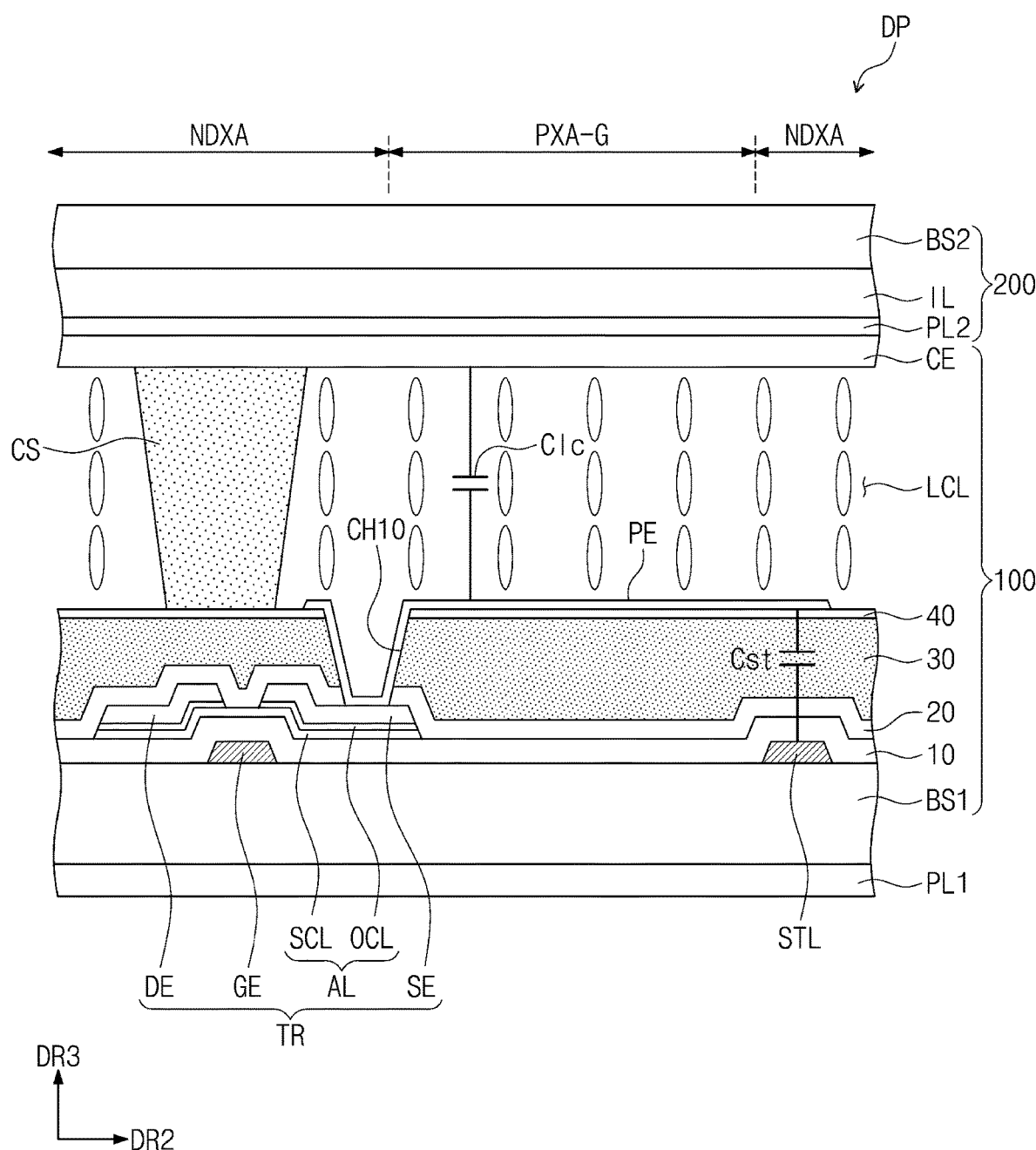

FIGS. 5A and 5B are cross-sectional views of a display panel DP according to an embodiment of the present invention. FIG. 5A illustrates a cross-section corresponding to a second pixel area PXA-G of a liquid crystal display panel DP. FIG. 5B illustrates a cross-section corresponding to a second pixel area PXA-G of an organic light-emitting display panel DP.

In an equivalent circuit, a pixel of the liquid crystal display panel DP illustrated in FIG. 5A may include a transistor TR, a liquid crystal capacitor Clc, and a storage capacitor Cst. The pixel of the liquid crystal display panel DP includes at least the liquid crystal capacitor Clc as a display element.

The liquid crystal display panel DP includes a lower display substrate 100 and an upper display substrate 200. The liquid crystal display panel DP includes first and second polarizing layers PL1 and PL2. The first polarizing layer PL1 may be disposed below the lower display substrate 100, and the second polarizing layer PL2 may constitute the upper display substrate 200. The second polarizing layer PL2 may include a wire grid.

A control electrode GE and a storage line STL are disposed on one surface of the first base substrate BS1. The first base substrate BS1 may be a glass substrate or a plastic substrate. A first insulating layer 10 for covering the control electrode GE and the storage line STL is disposed on the one surface of the first base substrate BS1. The first insulating layer 10 may include at least any one of an inorganic material or an organic material. An activation portion AL overlapping the control electrode GE may be disposed on the first insulating layer 10. The activation portion AL may include a semiconductor layer SCL and an ohmic contact layer OCL. The semiconductor layer SCL is disposed on the first insulating layer 10, and the ohmic contact layer OCL is disposed on the semiconductor layer SCL.

The semiconductor layer SCL may include amorphous silicon or polysilicon. Also, the semiconductor layer SCL may include a metal oxide semiconductor. The ohmic contact layer OCL may be doped with a dopant at higher concentration than the semiconductor layer SCL. The ohmic contact layer OCL may include two portions separated from each other. In an embodiment of the present invention, the ohmic contact layer OCL may have an integrated shape.

An input electrode DE and an output electrode SE are disposed on the activation portion AL. The input electrode DE and the output electrode SE are spaced apart from each other. A second insulating layer 20, which covers the activation portion AL, the input electrode DE, and the output electrode SE, is disposed on the first insulating layer 10. A third insulating layer 30 is disposed on the second insulating layer 20. The second insulating layer 20 and the third insulating layer 30 may include at least any one of an inorganic material or an organic material. The third insulating layer 30 is disposed on the second insulating layer 20. The third insulating layer 30 may be an organic layer that provides a flat surface. A fourth insulating layer 40 is disposed on the third insulating layer 30. The fourth insulating layer 40 may be an organic layer.

As illustrated in FIG. 5A, a pixel electrode PE is disposed on the fourth insulating layer 40. The pixel electrode PE may be connected to the output electrode SE through a through-hole CH10 that passes through the second insulating layer 20, the third insulating layer 30, and the fourth insulating layer 40. An alignment layer (not shown) for covering the pixel electrode PE may be disposed on the fourth insulating layer 40.

A second base substrate BS2 may be a glass substrate or a plastic substrate. An intermediate layer IL, a second polarizing layer PL2, and a common electrode CE are disposed on the lower surface of the second base substrate BS2. A liquid crystal layer LCL is operated by charging or discharging of the liquid crystal capacitor Clc, and source light provided from a backlight unit may be selectively provided to the intermediate layer IL after passing through the first polarizing layer PL1, the liquid crystal layer LCL, and the second polarizing layer PL2.

Although the intermediate layer IL is simply illustrated in the embodiment, the intermediate layer IL may have a stack structure disposed on the lower surface of a second base substrate BS2 of FIG. 5B. In addition, the intermediate layer IL may have the stack structure disposed on the lower surface of the base substrate BS2 described with reference to each of FIGS. 4A-4D. In the embodiment, the liquid crystal layer LCL and the common electrode CE are described as constituting a lower display substrate 100. In one aspect of the present invention, the liquid crystal layer LCL may be regarded as a component which is distinguished from the lower display substrate 100 and the upper display substrate 200.

Here, the cross-section illustrated in FIG. 5A is merely an example. Although the liquid crystal display panel in a vertical alignment (VA) mode is exemplarily described in FIG. 5A, an embodiment of the present invention may include a liquid crystal display panel in an in-plane switching (IPS) mode, a fringe-field switching (FFS) mode, a plane to line switching (PLS) mode, a super vertical alignment (SVA) mode, or a surface-stabilized vertical alignment (SS-VA) mode.

In the liquid crystal display panel in the in-plane switching (IPS) mode, the fringe-field switching (FFS) mode, or the plane to line switching (PLS) mode, a common electrode CE may be disposed on a first base substrate BS1.

Although the present invention has been described with reference to the embodiments, it will be understood that various changes and modifications of the present invention may be made by one ordinary skilled in the art or one having ordinary knowledge in the art without departing from the spirit and technical field of the present invention as hereinafter claimed.

Hence, the technical scope of the present invention is not limited to the detailed description in the specification but should be determined only in accordance with the appended claims According to the present invention, since the light-blocking pattern is not formed separately, the manufacturing costs of the display panel is reduced, and the manufacturing efficiency is improved. The present invention has high industrial applicability because providing the display panel which has the reduced external light reflection, prevents the color mixing between pixels, and prevents the light leakage in the light-blocking area.

The invention claimed is:

1. A display panel comprising:
    an upper display substrate comprising a first pixel area, a second pixel area, a third pixel area, and a light-blocking area around the first pixel area, the second pixel area, and the third pixel area; and
    a lower display substrate comprising a first display element, a second display element, and a third display element that correspond to the first pixel area, the second pixel area, and the third pixel area, respectively,
    wherein the upper display substrate comprises:
        a base substrate;
        a first color filter on the base substrate and overlapping the first pixel area;
        a second color filter on the base substrate, overlapping the second pixel area, and to allow light different in wavelength from that of the first color filter to pass therethrough;
        a third color filter on the base substrate, overlapping the light-blocking area and the third pixel area, having a first opening and a second opening that correspond to the first pixel area and the second pixel area, respectively, and to allow light different in wavelength from those of the first color filter and the second color filter to pass therethrough; and
        a fourth color filter on the base substrate, overlapping the light-blocking area, the first pixel area, and the second pixel area, having a third opening corresponding to the third pixel area, and to allow light different in wavelength from that of the third color filter to pass therethrough, and
    wherein the fourth color filter is adjacent to the first color filter, the second color filter, and the third color filter in the light-blocking area between first pixel area and the second pixel area.

2. The display panel of claim 1, wherein the third color filter is directly on a lower surface of the base substrate,
    wherein a portion of the third color filter is between the lower surface of the base substrate and the first color filter, and
    wherein the first color filter is between the lower surface of the base substrate and the fourth color filter.

3. The display panel of claim 2, wherein a portion of each of the first color filter and the second color filter is directly on the lower surface of the base substrate.

4. The display panel of claim 2, wherein the upper display substrate further comprises an encapsulation layer covering the fourth color filter.

5. The display panel of claim 1, wherein the upper display substrate further comprises:
    a first color control layer overlapping the first pixel area and comprising a first quantum dot to convert source light into first color light that passes through the first color filter; and
    a second color control layer overlapping the second pixel area and comprising a second quantum dot to convert the source light into second color light that passes through the second color filter.

6. The display panel of claim 5, wherein the upper display substrate further comprises a third color control layer overlapping the third pixel area and to allow the source light to pass therethrough.

7. The display panel of claim 6, wherein the third color control layer comprises a base resin and a scatterer dispersed in the base resin.

8. The display panel of claim 6, wherein the upper display substrate further comprises an encapsulation layer covering the first color control layer, the second color control layer, and the third color control layer.

9. The display panel of claim 1, wherein each of the first display element, the second display element, and the third display element comprises a first electrode, a second electrode, and a light-emitting layer between the first electrode and the second electrode, and
    wherein the light-emitting layers of the first display element, the second display element, and the third display element are integrally provided with each other.

10. The display panel of claim 1, wherein each of the first display element, the second display element, and the third display element comprises a liquid crystal capacitor.

11. A display panel comprising:
    an upper display substrate comprising a first pixel area, a second pixel area, a third pixel area, and a light-blocking area around the first pixel area, the second pixel area, and the third pixel area; and
    a lower display substrate comprising a first light-emitting element, a second light-emitting element, and a third light-emitting element that correspond to the first pixel area, the second pixel area, and the third pixel area, respectively, and to generate blue light,
    wherein the upper display substrate comprises:
        a base substrate;
        a color control layer on a lower surface of the base substrate and to convert the blue light into red light and green light;
        a red color filter on the lower surface of the base substrate and overlapping the first pixel area;
        a green color filter on the lower surface of the base substrate and overlapping the second pixel area;
        a blue color filter on the lower surface of the base substrate, overlapping the light-blocking area and the third pixel area, the blue color filter having a first opening and a second opening that correspond to the first pixel area and the second pixel area, respectively; and
        a yellow color filter on the lower surface of the base substrate, overlapping the light-blocking area, the first pixel area, and the second pixel area, and having a third opening corresponding to the third pixel area, and
    wherein the yellow color filter is adjacent to the red color filter, the green color filter, and the blue color filter in the light-blocking area between first pixel area and the second pixel area.

12. The display panel of claim 11, wherein the blue color filter is directly on the lower surface of the base substrate, wherein a portion of the blue color filter is between the lower surface of the base substrate and the red color filter, and wherein the red color filter is between the lower surface of the base substrate and the yellow color filter.

13. The display panel of claim 12, wherein a portion of each of the red color filter and the green color filter is directly on the lower surface of the base substrate.

14. The display panel of claim 11, wherein the color control layer further comprises:

a first color control layer overlapping the first pixel area and comprising a first quantum dot to convert the blue light into the red light; and a second color control layer overlapping the second pixel area and comprising a second quantum dot to convert the blue light into the green light, wherein the first color control layer is between the red color filter and the first light-emitting element, and wherein the second color control layer is between the green color filter and the second light-emitting element.

15. The display panel of claim 14, wherein the color control layer further comprises a third color control layer overlapping the third pixel area and to allow the blue light to pass therethrough.

16. The display panel of claim 15, wherein the third color control layer comprises a base resin and a scatterer dispersed in the base resin.

17. A display panel comprising:

an upper display substrate comprising a first pixel area, a second pixel area, a third pixel area, and a light-blocking area around the first pixel area, the second pixel area, and the third pixel area; and a lower display substrate comprising a first light-emitting element, a second light-emitting element, and a third light-emitting element that correspond to the first pixel area, the second pixel area, and the third pixel area, respectively, and to discharge blue light, wherein the upper display substrate comprises:

a base substrate;

a color control layer on a lower surface of the base substrate and to convert the blue light into red light and green light;

a first blue color filter on the lower surface of the base substrate, overlapping the light-blocking area, and having a first opening, a second opening, and a third opening that correspond to the first pixel area, the second pixel area, and the third pixel area, respectively;

a red color filter on the lower surface of the base substrate and overlapping the first pixel area;

a green color filter on the lower surface of the base substrate and overlapping the second pixel area;

a second blue color filter on the lower surface of the base substrate and overlapping the third pixel area; and a yellow color filter on the lower surface of the base substrate, overlapping the light-blocking area, the first pixel area, and the second pixel area, and having a fourth opening corresponding to the third pixel area, and wherein the yellow color filter is adjacent to the red color filter, the green color filter, and the blue color filter in the light-blocking area between first pixel area and the second pixel area.

18. The display panel of claim 17, wherein the first blue color filter is directly on the lower surface of the base substrate, wherein a portion of each of the red color filter, the green color filter, and the second blue color filter is directly on the lower surface of the base substrate, and wherein a portion of the first blue color filter is between the lower surface of the base substrate and the red color filter.

19. The display panel of claim 17, wherein the color control layer further comprises:

a first color control layer overlapping the first pixel area and comprising a first quantum dot to convert the blue light into the red light; and a second color control layer overlapping the second pixel area and comprising a second quantum dot to convert the blue light into the green light, wherein the first color control layer is between the red color filter and the first light-emitting element, and wherein the second color control layer is between the green color filter and the second light-emitting element.

20. The display panel of claim 17, wherein the color control layer further comprises a third color control layer overlapping the third pixel area and to allow the blue light to pass therethrough.

* * * * *